US007512525B2

(12) United States Patent
Lee et al.

(10) Patent No.: US 7,512,525 B2
(45) Date of Patent: Mar. 31, 2009

(54) MULTI-POINT MODEL REDUCTIONS OF VLSI INTERCONNECTS USING THE RATIONAL ARNOLDI METHOD WITH ADAPTIVE ORDERS

(75) Inventors: Herng-Jer Lee, Tao-Yuan (TW); Chia-Chi Chu, Tao-Yuan (TW); Wu-Shiung Feng, Tao-Yuan (TW); Chao-Kai Chang, Tao-Yuan (TW)

(73) Assignee: Chang Gung University, Kwei-Shan Tao-Yuan (TW)

( * ) Notice: Subject to any disclaimer, the term of this patent is extended or adjusted under 35 U.S.C. 154(b) by 584 days.

(21) Appl. No.: 11/029,587

(22) Filed: Jan. 5, 2005

(65) Prior Publication Data

US 2006/0149525 A1    Jul. 6, 2006

(51) Int. Cl.
*G06F 17/10* (2006.01)
(52) U.S. Cl. .............................................. 703/2; 703/14
(58) Field of Classification Search ...................... 703/2, 703/14, 13; 716/2, 3
See application file for complete search history.

(56) References Cited

OTHER PUBLICATIONS

Luis Miguel Silveira et al., "Efficient Reduced-Order Modeling of Frequency-Dependent Coupling Inductances Associated with 3-D Interconnect Structures", IEEE Transactions on Components, Packaging, and Manufacturing Technology-Part B, vol. 19, No. 2, May 1996.*

* cited by examiner

*Primary Examiner*—Paul L Rodriguez
*Assistant Examiner*—Luke Osborne
(74) *Attorney, Agent, or Firm*—Alan Kamrath; Kamrath & Associates PA

(57) ABSTRACT

A model reduction method utilizing the rational Arnoldi method with adaptive orders (RAMAO) is applied to high-speed VLSI interconnect models. The method is based on an extension of the classical multi-point Pade approximation, using the rational Arnoldi iteration approach. Given a set of predetermined expansion points, an exact expression for the error between the output moment of the original system and that of the reduced-order system, related to each expansion point, is derived first. In each iteration of the proposed RAMAO algorithm, the expansion frequency corresponding to the maximum output moment error will be chosen. Hence, the corresponding reduced-order model yields the greatest improvement in output moments among all reduced-order models of the same order.

8 Claims, 5 Drawing Sheets

US 7,512,525 B2

MULTI-POINT MODEL REDUCTIONS OF VLSI INTERCONNECTS USING THE RATIONAL ARNOLDI METHOD WITH ADAPTIVE ORDERS

BACKGROUND OF THE INVENTION

1. Field of the Invention

The present invention relates to multi-point model reductions of VSLI interconnects, and more particularly to multi-point model reductions of VLSI interconnects using rational arnoldi method with adaptive orders (RAMAO).

2. Description of Related Art

Interconnect plays a significant role in the recent development of high-speed VLSI design. Due to the continuous increasing in component densities and clock rates, the signal integrity problems naturally arise in the interconnect structure. For efficient simulations, it is necessary to construct a low-order macro-model whose terminal behaviors essentially capture the complicated interactions among the interconnects. The process of finding such a reduced network is referred to as model reduction [References 4, 6, 13-15 and 18].

Recently, several methods that are based on Pade synthesis have been applied to improve the model-order reduction techniques. Asymptotic waveform evaluation (AWE) [References 3 and 15], Pade via Lanczos (PVL) [Reference 6 and 7], and congruence transformations (CT) [Reference 13] have successfully been used to analyze interconnect systems. Among all existing methods, it has been shown that the class of Krylov-space methods seems to be more accurate, because it can avoid the ill-conditional problems. However, these conventional approximation methods tend to converge in a local fashion around a single frequency, because Pade approximation is exact at the point while accuracy is lost away from it. So the reduced-order model may grow large before becoming an acceptable global approximation. To overcome this difficulty, multi-point Pade has been proposed [References 2, 5, 12 and 18].

The straightforward way for multi-point moment matching applications is to apply the Krylov subspace algorithm at various expansion frequencies. This is the so-called rational Krylov algorithm [references 1, 9 and 16]. The present invention uses the RAMAO to simplify the conventional algorithm without determining the order of moments at each expansion frequency in advance. The concept was first developed in the rational Lanczos method [reference 8]. In this work, the exact error between the output moment of the original system and that of the reduced-order system, associated with each expansion point, can be determined explicitly. In each iteration of the proposed method, the expansion frequency corresponding to the maximum output moment error is chosen. Consequently, the corresponding reduced-order model will yield the greatest improvement in output moments among all reduced-order models of the same order.

SUMMARY OF THE INVENTION

The main objective of the present invention is to provide improved multi-point model reductions of VLSI interconnects using rational Arnoldi method with adaptive orders.

To achieve the objective, the present invention proposes a model reduction method, the rational Arnoldi method with adaptive orders (RAMAO), to be applied to high-speed VLSI interconnect models. It is based on an extension of the classical multi-point Pade approximation, using the rational Arnoldi iteration approach. Given a set of predetermined expansion points, an exact expression for the error between the output moment of the original system and that of the reduced-order system, related to each expansion point, is derived first. In each iteration of the proposed RAMAO algorithm, the expansion frequency corresponding to the maximum output moment error will be chosen. Hence, the corresponding reduced-order model yields the greatest improvement in output moments among all reduced-order models of the same order.

Further benefits and advantages of the present invention will become apparent after a careful reading of the detailed description with appropriate reference to the accompanying drawings.

DETAILED DESCRIPTION OF THE INVENTION

Circuit Equation and Moment

Figure 1:
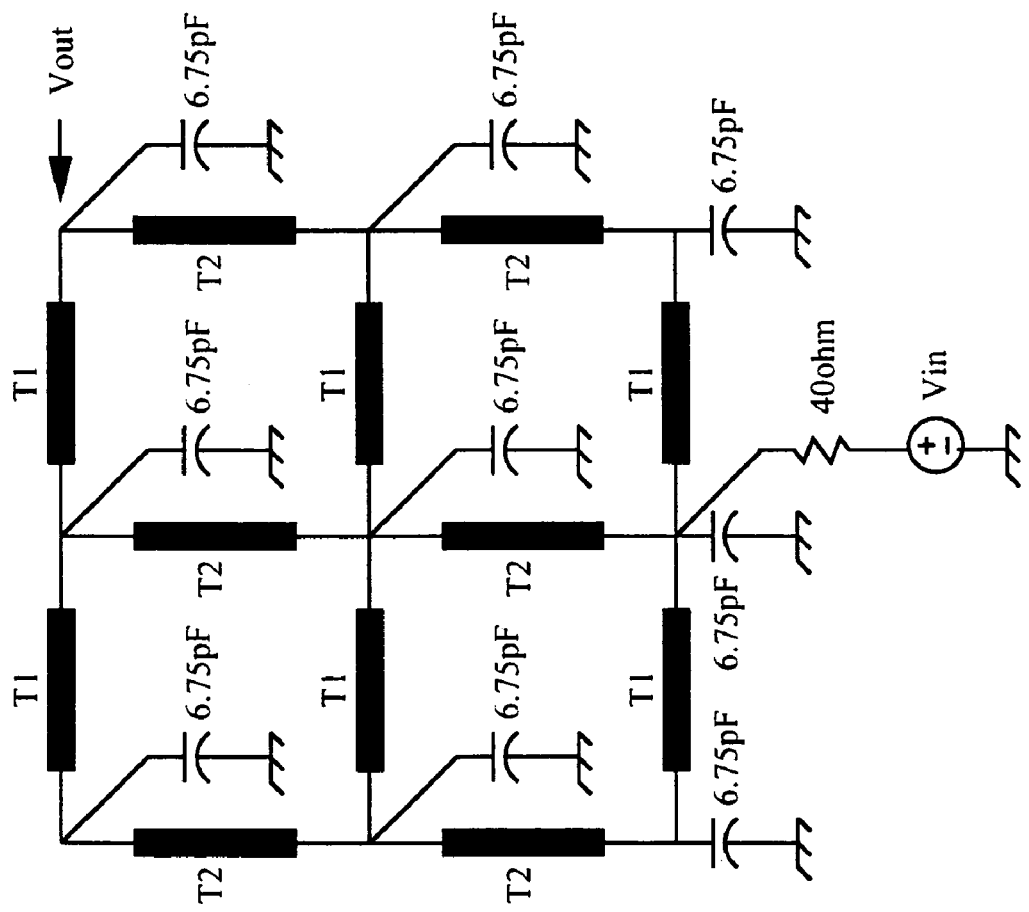
FIG. 1 is a mesh circuit.

In analyzing an RLC circuit, the modified nodal analysis (MNA) can be applied as follows [References 13 and 18].

$$E\frac{dx(t)}{dt} = Ax(t) + bu(t), \text{ and } y(t) = c^T x(t), \qquad (1)$$

where state vector $x(t) \in R^n$ includes node voltages and branch currents of inductors; $u(t) \in R$ is the input excitation, and $y(t) \in R$ is the output. The descriptor matrix $E \in R^{n \times n}$ contain capacitances and inductances; the system matrix $A \in R^{n \times n}$ contain conductances and resistances; the input vector is $b \in R^n$, and the output incidence vector is $c \in R^n$. The above system is large-scale, sparse, and stable. The model order reduction problem is to find a q-order system (2), q<<n, $$\hat{E}\frac{d\hat{x}(t)}{dt} = \hat{A}\hat{x}(t) + \hat{b}u(t), \hat{y}(t) = \hat{c}^T \hat{x}(t), \qquad (2)$$

where $\hat{E}, \hat{A} \in C^{q \times q}$, $\hat{x}, \hat{b}, \hat{c} \in C^q$, and $\hat{y} \in C$. The reduced-order system is expected to capture the essential dynamic behaviors of the original system and to reduce the computational cost during the whole simulation process.

Suppose that $u(t)$ is an impulse function. Taking the Laplace transform yields the transfer function of the original system as $y(s) = c^T X(S) = c^T(sE - A)^{-1}b$. Expanding $X(s)$ in power series about various frequencies $s_i \in C$ for $i = 1, 2 \ldots, \hat{i}$, $$X(s) = \sum_{j=0}^{\infty} X^{(j)}(s_i)(s - s_i)^j,$$

where $X^{(j)}(s_i)=[-(s_iE-A)^{-1}E]^j(s_iE-A)^{-1}b$ and $Y^{(j)}(s_i)=c^T X^{(j)}(s_i)$. $X^{(j)}(s_i)$ is called the jth-order system moment of $X(s)$; and $Y^{(j)}(s_i)$ represents the jth-order output moment of $Y(s)$ at $s_i$.

Krylov Subspace

One efficient way of obtaining a reduced-order system is to use the multi-point Pade approximation (or multi-point moment matching) [Reference 2]. The multi-point Pade approximation requires that the output moment of the original system equals that of the reduced system, $Y^{(j)}(s_i)=\hat{Y}^{(j)}(s_i)$, $j=0, 1, \ldots, \hat{j}_i$, $i=1,2,\ldots \hat{i}$. Notably, if $\hat{i}=1$, the above equation is indeed the conventional Pade approximation. However, this method usually yields an ill-conditioned problem [Reference 6]. Recent works have proposed Krylov subspace projection methods to avoid such numerical difficulties [References 4, 6, 13 and 18]. The reduced-order system is constructed by projecting an original large-dimensional problem into a low-dimensional Krylov subspace.

Given a square matrix $\Psi \in C^{n \times n}$ and a vector $\xi \in C^n$, the qth Krylov sequence $K_q(\Psi,\xi) \equiv (\xi, \Psi\xi, \Psi^2\xi, \ldots \Psi^{q-1}\xi)$ is a sequence of q column vector and the corresponding column space is called the qth Krylov space [Reference 1]. The Arnoldi algorithm can be applied to iteratively generate an orthonormal basis $V_q \in C^{n \times q}$ from the successive Krylov subspace $K_q(\Psi,\xi)=\mathrm{span}\{v_1,v_2,\ldots,v_q\}$, where $v_i \in V_q, i=1,\ldots,q$. Set $\Psi=-(s_iE-A)^{-1}E$ and $\xi=(s_iE-A)^{-1}b$. The Kyrlov subspace $K_q\{\Psi,\xi\}$ is indeed spanned by the system moments $X^{(j)}(s_i)$ for $j=0,1 \ldots q-1$. The reduced-order $\hat{Y}(s)$ can be constructed using the orthogonal projection $x(t)=V_q\hat{x}(t)$. In such a situation, the reduced system parameters in Eq. (2) can be defined by the congruence transformation [Reference 13 and 18], $$\hat{E}=V_q^T E V_q, \hat{A}=V_q^T A V_q, \hat{b}=V_q^T b, \text{ and } \hat{c}=V_q^T c \quad (3)$$

The number of moments in the reduced system is exactly the number of moments in the original system at an expansion frequency $s_i$, up to the order of q, that is, $Y^{(j)}(s_i)=\hat{Y}(s_i)$, for $j=0,1,\ldots,q-1$.

Adjoint Network Reduction

Suppose that $c=b$. The signature matrix $S$ is defined as $S=[I_{nv}0;0-I_{ni}]$ so that $S^{-1}=S, SES=E, SAS=A^T$, and $Sb=b$ [11, 18]. Suppose that $X^{(j)}(s_i) \in \mathrm{colspan}\{V_q\}$ for $j=0,1\ldots,\hat{j}-1$ and $i=1,2,\ldots,\hat{i}$. $V_q$ is the orthonormal matrix generated iteratively by the AORA algorithm. Assuming $U=[V\ SV_q]$ is the congruence transformation matrix for model-order reductions, then $$\hat{Y}^{(j)}(s_i)=Y^{(j)}(s_i), \text{ for } j=0,1,\ldots,2\hat{j}-1 \text{ and } i=1,2,\ldots,\hat{i} \quad (4)$$

Therefore, the cost about constructing the congruence transformation matrix can be simplified up to 50% of the previous methods.

A rational Arnoldi method, which uses multiple expansion points, was developed to implement the multi-point Pade approximation. To simplify the developments, the number of the matched moments of the reduced-order system at each expansion point are assumed to be fixed. Formally, assume $S=(s_1,s_2,\ldots s_{\hat{i}})$ represent the set of predetermined expansion frequencies. Assume $j=(\hat{j}_1,\hat{j}_2,\ldots \hat{j}_{\hat{i}})$ is the set of the number of the matched moments at each corresponding frequency. The rational Arnoldi method will generate a reduced-order system transfer function $\hat{Y}(s)$ which matches q-order $$\left(q=\sum_{i=1}^{\hat{i}} \hat{j}_i\right)$$

moments of the original system transfer function, $Y(s)$, at the expansion points $s_i, i=1,\ldots,\hat{i}$.

Implementing the rational Arnoldi method is equivalent to implementing the Arnoldi method $\hat{j}_i$ times at $\hat{i}$ expansion frequencies. That is, the first $\hat{j}_1$ iterations correspond to the expansion frequency $s_1$; the next $\hat{j}_2$ iterations are associated with $s_2$, and so on. Each Arnoldi iteration generates $\hat{j}_i$ orthonormal vectors. Then, $V_q=[v_1,v_2,\ldots,v_q]$ is the desired orthonormal matrix generated from a union Krylov space at various expansion points, as stated by $$K_q = \left[X^{(0)}(s_1), \ldots, X^{(\hat{j}_1-1)}(s_1), \ldots, X^{(0)}(s_{\hat{i}}), \ldots, X^{(\hat{j}_{\hat{i}}-1)}(s_{\hat{i}})\right].$$

Table 1 refers to the algorithm of the rational Arnoldi method.

TABLE 1

Rational Arnoldi Algorithm

```
Algorithm 1: RA (input: E, A, b, S, J; output: V_q)
(1): /* Initialize */
r_0 := (s_1E − A)^−1 b
(2): /* Begin RA Iterations */
for i = 1, 2, ..., î do
    for j = 1, 2, ..., ĵ_i do
        k := (i − 1)ĵ_i + j
        (2.1): /* Generate the New v_k */
        h_{k,k−1} := ||r_{k−1}||, v_k := r_{k−1}/h_{k,k−1}
        (2.2): /* Update r_k for the Next Iteration */
        if j = ĵ_i and i <= î then r_k := (s_{i+1}E − A)^−1 b
        else r_k := −(s_iE − A)^−1 E v_k
        end if
        for t = 1, 2, ..., k do
            h_{t,k} := v_t^H r_k, r_k := r_k − h_{t,k} v_t
        end for
    end for
end for
q := Σ_{i=1}^{î} ĵ_i, H_q := [h_{i,j}]_{i,j=1,2,...,q}
V_q = [v_1 v_2 ... v_q]
(3): /* Yield Real V_q for Complex Expansion Points */
if there exists any s_i ∈ S such that s_i is not real
then V_r := real(V_q), V_i := imag(V_q)
    [V_q, rr] = qr([V_r V_i])
end if
```

Special attention should be paid to any change of the expansion point. Step (Krylov Subspace) gives relevant details. If the expansion points remains unchanged, $j=\hat{j}_i$ and $i \leq \hat{i}$, then the residue vector $r_k$ is the same as that used in the Arnoldi method. However, if the expansion point is changed, then, the residue vector $r_k$ can be reset to $(s_{i+1}E-A)^{-1}b$, which is equal to the system moment $X^{(0)}(s_{i+1})$ for the subsequent expansion frequency $s_{i+1}$. Hence, this expression intuitively captures the concept of moments. Moreover, the errors between the output moments of the original model and those of the reduced-order model can be exactly and efficiently calculated from the residue vectors, stated in Theorem 2 in detail. Accordingly, the specific choice of the residue vector in Step (2.2) plays a crucial role in developing the proposed RAMAO method. Given the settings specified in Step (2.2), the new orthonormal vector $v_k$ and the orthonormal matrix $V_{k-1}$ generated in earlier iterations can indeed span the entire Krylov subspace. Once the orthonormal matrix $V_q$ has been formed by applying the rational Arnoldi method, the reduced-order system can be obtained using the congruence transformation. The following Theorem 1 indicates that the output moments can be matched.

THEOREM 1. [Reference 10] Assume that $V_q$ is the orthonormal matrix generated by the rational Arnoldi algorithm with q iterations. Since $X^{(j)}(s_i) \in \text{colspan}\{V_q\}$ for $j=0,1,\ldots,\hat{j}_i$ and $i=1,2,\ldots \hat{i}$, $$X^{(j)}(s_i)=V_q \hat{X}^{(j)}(s_i) \text{ and } Y^{(j)}(s_i)=\hat{Y}^{(j)}(s_i) \quad (5)$$

The Ramao Method

As stated in the last section, selecting a set of expansion points $s_i$ for $i=1,\ldots,\hat{i}$ and the number of matched moments $\hat{j}_i$ about each $s_i$ is not trivial. For simplicity, the expansion points $s_i$ for $i=1,\ldots,\hat{i}$ are determined in advance using engineering heuristics or experimental measurements over a specified frequency range. This section describes an intelligent scheme for choosing multiple expansion points in each iteration.

Assume that $Y^{(j)}(s_i)=\hat{Y}^{(j)}(s_i)$ for $j=1,2,\ldots \hat{j}_i$ and $i=1, 2,\ldots, \hat{i}$ after q iterations of the rational Arnoldi algorithm. However, the (j+1)st-order output moments $Y^{(j+1)}(s_i)=\hat{Y}^{(j+1)}(s_i)$ can be guaranteed. The concept that underlines the RAMAO method is employed to select an expansion point $s_{i*_{q+1}}$ in the (q+1) st iteration. Hence, the resulting (q+1)st-order reduced model yields the greatest moment improvement $|Y^{(j+1)}(s_{i*_{q+1}})-\hat{Y}^{(j+1)}(s_{i*_{q+1}})|$ of the qth-order reduced-order model. The moment errors can be directly obtained in the new iteration without explicitly calculating system moments. Table 2 shows the algorithm of the RAMAO method. The vector S includes $\hat{i}$ expansion points; q is the total number of iterations, and $V_q$ is the resulting orthonormal matrix. The main difference between the rational Arnoldi method and the RAMAO method is in Step (2.1).

---

Algorithm 2: RAMAO (input: E, A, b, c, S, q; output: $V_q$)
(1): /* Initialize */
for each $s_i \in S$ do
    $k^{(0)}(s_i) := (s_i E - A)^{-1} b$, $r^{(0)}(s_i) := k^{(0)}(s_i)$
    $h_\pi(s_i) := 1$
end for
(2): /* Begin RAMAO Iterations */
for $j = 1, 2, \ldots, q$ do
    (2.1): /* Select the Expansion Frequency with the
              Maximum Output Moment Error*/
    Choose $s_i \in S$ as the i giving $\max_i(|h_\pi(s_i) c^T r^{(j-1)}(s_i)|)$
    Set $s_{i_j}^*$ be the expansion frequency in the jth iteration
    (2.2): /* Generate the Orthonormal Vector at $s_{ij}^*$ */
    $h_{j,j-1}(s_{ij}^*) := \|r^{(j-1)}(s_{ij}^*)\|$
    $v_j = r^{(j-1)}(s_{ij}^*)/h_{j,j-1}(s_{ij}^*)$
    $h_\pi(s_{ij}^*) := h_\pi(s_{ij}^*) \cdot h_{j,j-1}(s_{ij}^*)$
    (2.3): /* Update $r^{(j)}(s_i)$ for the Next Iteration */
    for each $s_i \in S$ do
        if $(s_i == s_{ij}^*)$ then $k^{(j)}(s_{ij}^*) := -(s_i E - A)^{-1} E v_j$
        else $k^{(j)}(s_i) := k^{(j-1)}(s_i)$
        end if
        $r^{(j)}(s_i) := k^{(j)}(s_i)$
        for $t = 1, 2, \ldots, j$ do
            $h_{t,j}(s_i) := v_t^H r^{(j)}(s_i)$
            $r^{(j)}(s_i) := r^{(j)}(s_i) - h_{t,j}(s_i) v_t$
        end for
    end for
end for
$V_q = [v_1\ v_2 \ldots v_q]$
(3): /* Yield Real $V_q$ for Complex Expansion Points */
if there exists any $s_i \in S$ such that $s_i$ is not real
then $V_r := \text{real}(V_q), V_i := \text{imag}(V_q)$
    $[V_q, rr] = qr([V_r\ V_i])$
end if

---

The RAMAO method comprises the following steps. Step (1): Initialize the first vector $k^{(0)}(s_i)=(s_i E-A)^{-1} b$ of the Krylov sequence for each expansion points $s_i$, where $i \in \{1,\ldots \hat{i}\}$. Since the reduced-order model and the orthonormal matrix are not yet determined, the residue $r^{(0)}(s_i)$ for each $s_i$ is set to $k^{(0)}(s_i)$. The normalization coefficient about each $s_i$, $h_\pi(s_i)$, is initialized to be one.

Step (2.1): Choose an expansion frequency $s_i$ such that $s_i$ gives the greatest difference between the (j+1)st-order output moment of the original system Y(s) and that of the reduced-order system $\hat{Y}(s)$, that is, $\max_{s_i \in S}|Y^{(j+1)}(s_i)-\hat{Y}^{(j+1)}(s_i)|=\max_{s_i \in S}|h_\pi(s_i) c^T r^{(j-1)}(s_i)|$. $\hat{Y}^{(j+1)}(s_i)$ is the (j+1)st-order output moment of the reduced-order model $\hat{Y}(s)$, which if yielded using the congruence transformation matrix $V_{j-1}(j > 1)$ and matches j-order output moments of Y(s) at $s_i$. The chosen expansion frequency in the jth iteration is called $s_{i*_j}$.

Step (2.2): After the chosen expansion point $s_{i*_j}$ in jth iteration has been determined, the single-point Arnoldi method is applied at the expansion point $s_{i*_j}$. The new orthonormal vector $v_j$ is incorporated into the orthonormal matrix $V_{j-1}$. The normalization coefficient $h_\pi(s_i)=\Pi_j\|r^{(j-1)}(s_i)\|$ if $s_i$ is selected in the jth iteration.

Step (2.3): Determine the new residual $r^{(j)}(s_i)$ at each expansion point $s_i$. The calculation involves a projection with the new orthonormal matrix $V_j$. The next vector $k^{(j)}(s_{i*_j})$ at the frequency $s_{i*_j}$ must be updated to enable further matching of the output moment in the (j+1)st iteration. Since no improvement is obtained at the other unselected frequency $s_i$, the vector $k^{(j)}(s_i)$ at frequency $s_i$ in the current iteration remains $k^{(j-1)}(s_i)$, which was obtained in the preceding iteration.

Step (3): Generate the real orthogonal matrix $V_q$ by using the reduced QR factorization if there exists any complex expansion points.

The following theorem presents an exact formula for the output moment errors used in Step (2.1).

THEOREM 2. [Reference 10] Suppose that the output moments of the original system and those of the reduced-order system are matched, that is, $Y^{(j)}(s_i)=\hat{Y}^{(j)}(s_i)$ for $i=0, 1,\ldots,\hat{j}_i-1$ and $i=1,2,\ldots,\hat{i}$. The system matrices of reduced-order system are generated by the congruence transformation with the othonormal matrix $V_q$ using the RAMAO algorithm, where $q=\Sigma_{i=1}^{\hat{i}} \hat{j}_i$. The magnitude error between the $\hat{j}_i$th-order moments $Y^{(\hat{j}_i)}(s_i)$ and $\hat{Y}^{(\hat{j}_i)}(s_i)$ at each expansion point $s_i$ can be expressed as follows:

$$|Y^{(\hat{j}i)}(s_i)-\hat{Y}^{(\hat{j}i)}(s_i)|=|h_\pi(s_i) c^T r^{(\hat{j}i-1)}(s_i)|, \quad (6)$$

where $h_\pi(s_i)=\Pi_j \|r^{(j-1)}(s_i)\|$. Moment matching can still be preserved by following the similar proof of Theorem 1.

To demonstrate that the greatest improvement in output moments in each RAMAO iteration can yield the reduced-order model with better overall performances in frequency responses, there are two observations:

1. In the first iteration in the RAMAO method, the Step (2.2) is to choose $s_i \in S$ such that $\max(|c^T(s_i E-A)^{-1} b|)=\max(|Y(s_i)|)$. This is equivalent to finding out the expansion frequency with the maximum magnitude in the output frequency response.

2. The residual error, defined as $r(s)=b-(sE-A)V\hat{x}(s)$, is an effective and efficient estimator for modeling error [Reference 9]. A sufficiently small $r(s_0)$ at some $s_0$ typically implies a small error at $s_0$.

$$r(s) = (sE - A)\left(\sum_{j=\hat{j}_i+1}^{\infty} \left(X^j(s_i) - V\hat{X}^j(s_i)\right)(s-s_i)^j\right).$$

Ignoring the occurrences that $s_0$ is near an eigenvalue of (A,E) and assuming that the predetermined expansion points are chosen for minimizing $(s-s_i)^j$ and the high-order terms, $$r(s) \approx X^{\hat{j}+1}(s_i) - V\hat{X}^{\hat{j}+1}(s_i).$$

Ignoring the occurrences that $s_0$ is near an eigenvalue of (A,E) and assuming that the predetermined expansion points are chosen for minimizing $(s-s_i)^j$ and the high-order terms, we have $$r(s) \approx X^{\hat{j}+1}(s_i) - V\hat{X}^{\hat{j}_i+1}(s_i).$$

Experimental Results

A mesh twelve-line circuit, presented in FIG. 1, is studied to show the efficiency of the method of the present invention. The line parameters of the horizontal lines are $T_1$:R= 0.05 Ω/mm,L=0.5025 nH/mm,C=0.155 pF/mm and those of the vertical lines are $T_2$:R=0.06 Ω/mm,L=0.5480 nH/mm, C=0.1423 pF/mm. Each line is 30 mm long and divided into 20 sections. Therefore, the dimension of the system matrices is n=719, m=1, and p=1. The frequency response between 0 and 5 GHz at the voltage $V_{out}$ is investigated, and a total of 1001 frequency points are distributed uniformly for simulations. Three reduced-order models are examined.

1. The Arnoldi method at an expansion frequency of 0 hz with 40 iterations;
2. The Arnoldi method at an expansion frequency of s=2 πj×5 GHz with 20 iterations; and
3. The RAMAO method at the expansion frequencies of S=2 πj×{1 Hz, 0.83 GHz, 1.67 GHz, 2.50 GHz, 3.33 GHz, 4.17 GHz, 5 GHz} with 20 iterations.

Figure 2:
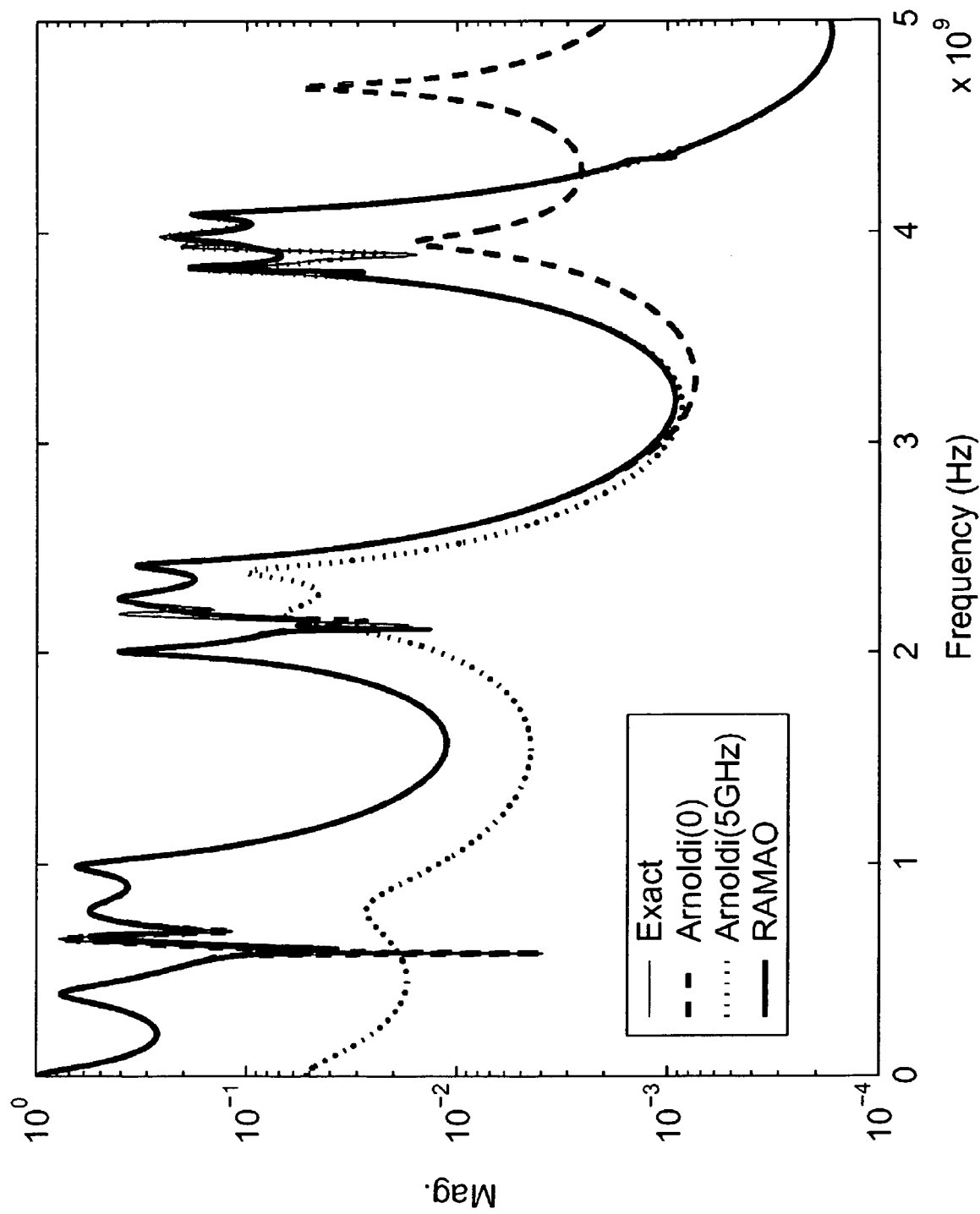
FIG. 2 shows frequency responses of the voltage at Vout in the mesh circuit in FIG. 1.

The real congruence transformation is used, so the dimensions of these reduced-order models are all equal to 40. FIG. 2 shows the corresponding waveforms. Comparing the average relative errors, corresponding to 1001 sampling frequency points, in frequency response of the three reduced-order models obtains (a) the error of the model yielded by the Arnoldi algorithm at 0 Hz: 436%; (b) that yielded by the Arnoldi algorithm at 2 πj*5 GHz:60.0%, and (c) that yielded by the AORA algorithm: 14.4%. From simulation results, the following observations exist:

1. The error between the original model and the reduced-order model by the Arnoldi method at frequency 0 is very small near the low frequency. Also, the error between the original model and the reduced-order model by the Arnoldi method at 3GHz near the high frequency is relatively small. The above results illustrate that the single-point Arnoldi method can only capture the local characteristics near their expansion points.

2. The reduced-order model by the RAMAO method can reflect the dynamical behaviors over a more wide frequency range than the above models. It is not hard to see that it shows the best performance among all simplified models by their intelligently selecting scheme.

Figure 3:
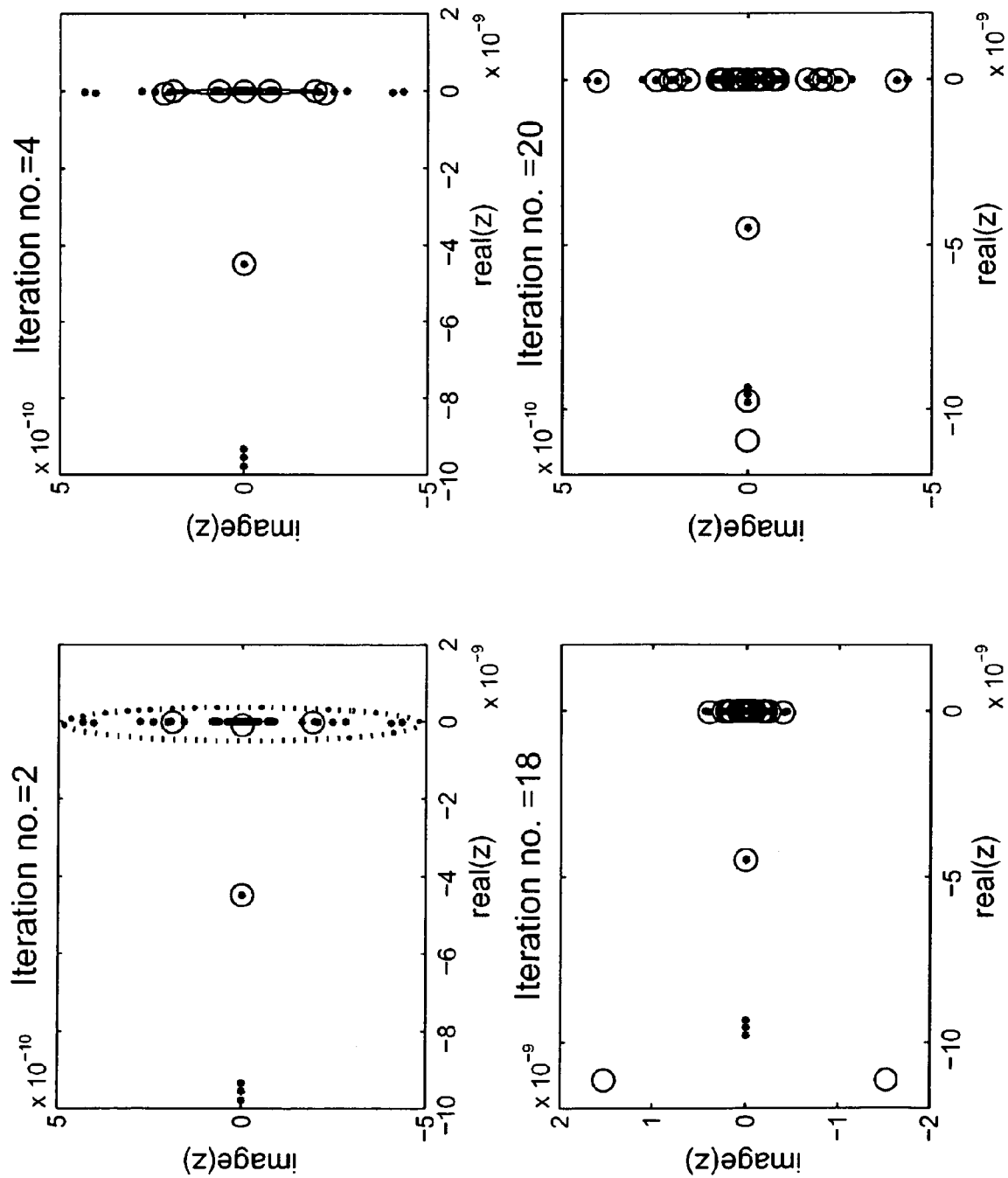
FIG. 3 shows the RAMAO lemniscates at iterations 2, 4, 18 and 20.

FIG. 3 shows the RAMAO lemniscates at iterations 2, 4, 18 and 20, where star "*", circle "o", and dash "—" represent eigenvalues of the original model and the corresponding reduced-order model and lemniscates, respectively. These lemniscates help to observe the convergence behavior of approximation eigenvalues generated by the RAMAO method [Reference 17]. As the iteration number increases, components of these lemniscates typically appear, which surround the extreme eigenvalues of $-\hat{A}^{-1}\hat{E}$ and then shrink rapidly to a point, namely the eigenvalue itself. Some observations need to be addressed: (1) the convergence range is big at first and then shrinks; (2) the approximate eigenvalues almost converge to the outer eigenvalues at the $20^{th}$ iteration. The inner ones can not be distinguished.

Figure 4:
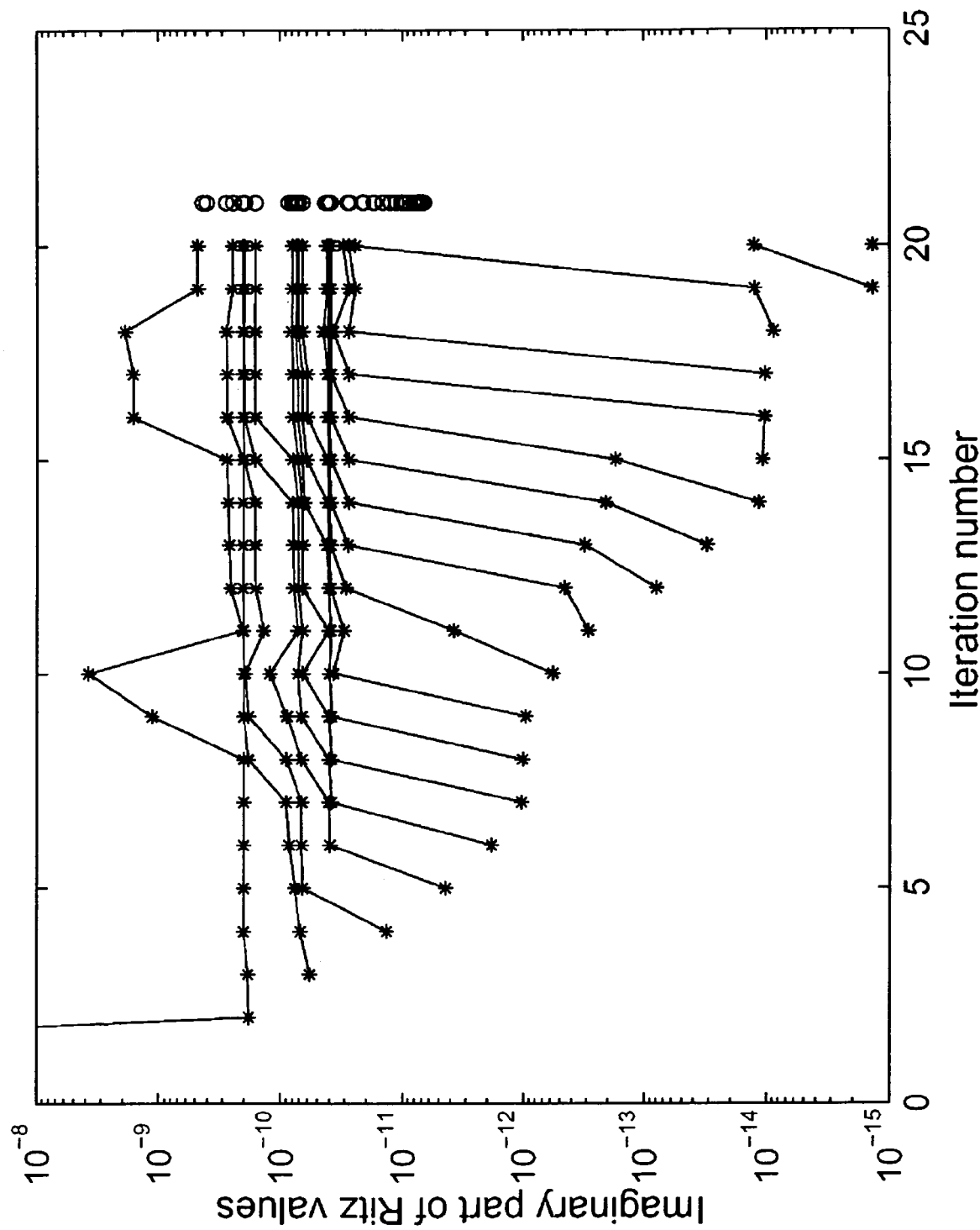
FIG. 4 shows the imaginary part of Rtiz values.

Also, in order to take a view of the convergence mechanism of the RAMAO iteration, a class of views of the convergence process appear in FIG. 4. The figure shows the Ritz values, which are the approximate eigenvalues yielded by the RAMAO algorithm for the steps from q=1 to q=20. The eigenvalues and Ritz values are represented by circle 'o' and point '.', respectively. The lines connecting the points help to view the path of convergence. It can be observed that the dispersive eigenvalues have fast convergence and the dense ones do not. Hence, more iterations are needed to split the dense eigenvalues if better performances are desired. Note that no ghost eigenvalue exists in FIG. 4.

Next, consider the frequency response of the current that leaves from the voltage source, that is, c=b. Set the iteration number q=20. Two reduced-order models by the RAMAO method with different sets of the number of the matched moments at each expansion point are examined. First, both the orthnormal matrices $V_q$ and $V_{2q}$ are yielded by the RAMAO algorithm with 20 and 40 iteration numbers, respectively. Next, the reduced-order models generated by two projectors: (1) $U_1=V_{2q}$ and (2) $U_2=[V_q SV_q]$. The total number of matched moments of the two reduced-order models is the same.

Figure 5:
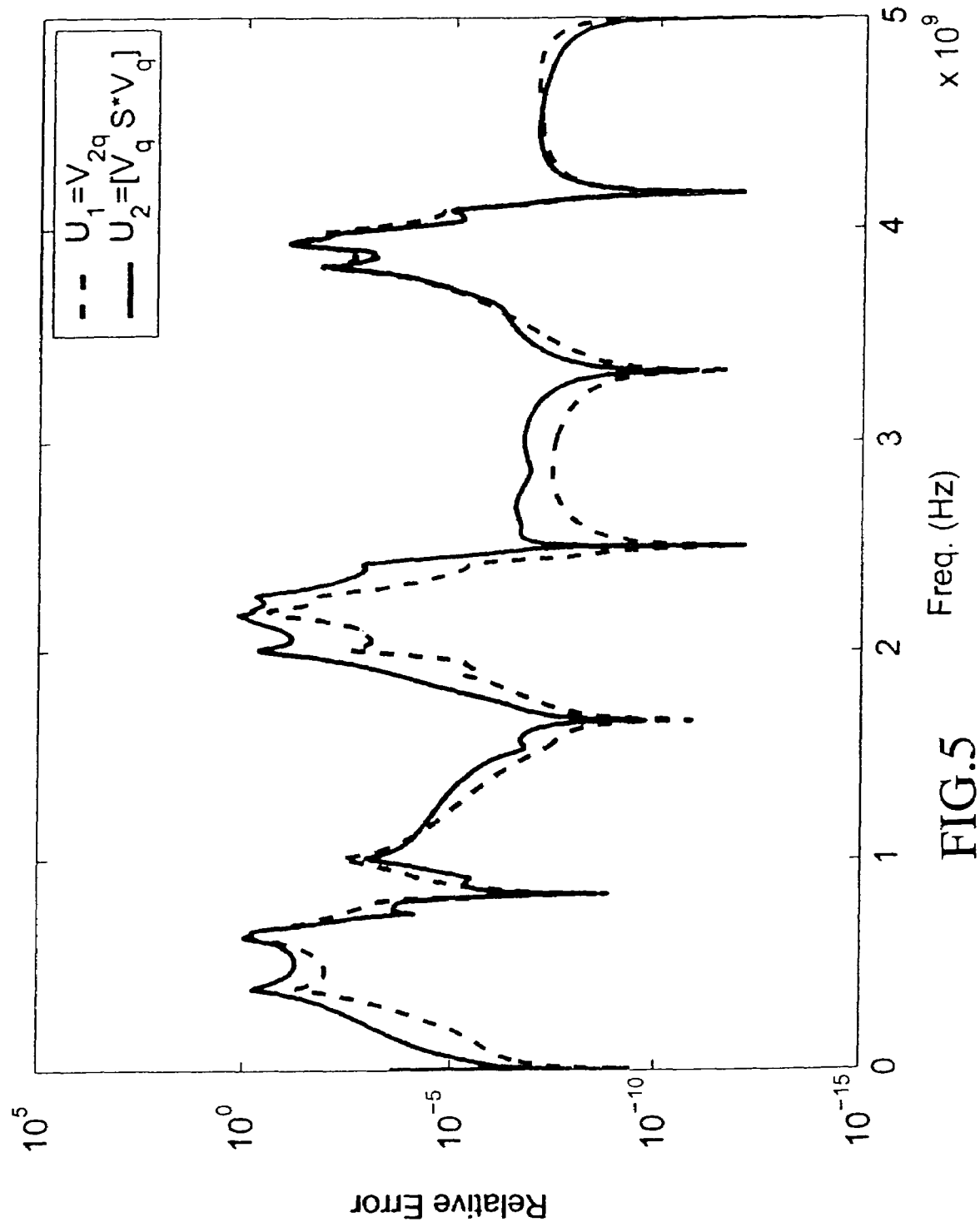
FIG. 5 shows errors in frequency responses of the current leaving from the voltage source in the mesh circuit.

Table 3 summarizes the order of moments to be matched at each expansion points of the RAMAO algorithm. Their corresponding relative errors of frequency responses are displayed in FIG. 5. Comparing their corresponding average relative error (1) 1.22% and (2) 4.04% in FIG. 5, the error of the model yielded by applying $V_{2q}$, which is obtained by performing the RAMAO algorithm 10 iterations more than the others, is the smallest. The result implies that the model generated by the RAMAO method with more iterations can indeed yield the greatest improvement not only in output moments but also in the frequency response among all reduced-order models with the same order.

TABLE 3

Selection scheme of the RAMAO method

| Frequency (×2πj) | Selecting Order | | | | |
|---|---|---|---|---|---|
| | ($U = V_q$) | | ($U = V_{2q}$) | | |
| 1 Hz | 2 | 8 | 2 | 8 | 16 |
| 0.83 GHz | 4 | 10 | 4 | 10 | 15 |
| 1.67 GHz | 7 | — | 7 | 11 | 19 |
| 2.50 GHz | 5 | — | 5 | 12 | 18 |
| 3.33 GHz | 6 | — | 6 | 14 | — |
| 4.17 GHz | 3 | 9 | 3 | 9 | 17 |
| 5 GHz | 1 | — | 1 | 13 | 20 |

CONCLUSIONS

A general framework for constructing a reduced-order system has been developed using a RAMAO method. The proposed framework extends the classical multi-point Pade approximation, using the rational Arnoldi iteration method. In each iteration, the expansion frequency will be chosen to generate the greatest improvement of output moments. The proposed method is highly suitable for large-scale electronic systems. An application of the circuit simulation has been considered to illustrate the accuracy and the efficiency of the proposed method.

REFERENCES

[1] Z. Bai, J. Demmel, J. Dongarra, A. Ruhe, H. van der Vorst, and editors. *Templates for the Solution of Algebraic Eigenvalue Problems: A Practical Guide.* SLAM, Philadelphia, 2000.

[2] M. Celik, O. Ocali, M. A. Tan, and A. Atalar. Pole-zero computation in microwave circuits using multi-point Pade approximation. *IEEE Trans. Circuits and Systems-I Fundamental Theory and Applications,* 42:6-13, 1995.

[3] E. Chiprout and M. S. Nakhla. *Asymptotic Waveform Evaluation and Moment Matching for Interconnect Analysis.* Kluwer Academic Publishers, Boston, 1994.

[4] M. Chou and J. K. White. Efficient formulation and model-order reduction for transient simulation of three-dimensional VLSI interconnect. *IEEE Trans. CAD,* 16:1454-1476, 1997.

[5] I. M. Elfadel and D. D. Ling. A block rational Arnoldi algorithm for multipoint passive model-order reduction of mutiport RLC networks. In *Proc. ICCAD 97,* pages 66-71, 1997.

[6] P. Feldmann and R. W. Freund. Efficient linear circuit analysis by Pade approximation via the Lanczos process. *IEEE Trans. CAD,* 14:639-649, 1995.

[7] R. W. Freund. Krylov-subspace methods for reduced-order modeling in circuit simulation. *Journal of Computational and Applied Mathematics,* 123:395-421, 2000.

[8] K. Gallivan, E. J. Grimme, and P. V. Dooren. A rational Lanczos algorithm for model reduction. *Numerical Algorithms,* 12:33-63, 1996.

[9] E. J. Grimme. *Krylov Projection Methods for Model Reduction.* PhD thesis, University of Illinois at Urbana-Champaign, 1997.

[10] H. J. Lee, C. C. Chu, and W. S. Feng. An adaptive-order rational arnoldi method for model-order reductions of linear time-invariant systems. Technical report, Chang Gung Univ., 2003.

[11] H. J. Lee, C. C. Chu, and W. S. Feng. Interconnect modeling and sensitivity analysis using adjoint networks reduction technique. In *Proc. ISCAS* 2003, pages 648-651, 2003.

[12] T. V. Nguyen and J. Li. Multipoint Pade approximation using a rational block Lanczos algorithm. In *Proc. ICCAD 97,* pages 72-75, 1997.

[13] A. Odabasioglu, M. Celik, and L. Pileggi. PRIMA: Passive reduced-order interconnect macromodeling algorithm. *IEEE Trans. On CAD,* 17:645-653, 1998.

[14] J. R. Phillips, L. Daniel, and L. M. Silveira. Guaranteed passive balancing transformations for model order reduction. *IEEE Trans. On CAD,* 22:1027-1041, 2003.

[15] L. T. Pillage and R. A. Rohrer. Asymptotic waveform evaluation for timing analysis. *IEEE Trans. On CAD,* 9:352-366. 1990.

[16] A. Ruhe. Rational Krylov sequence methods for eigenvalue computation. *Lin. Alg. Appl.,* 58:391-405, 1984.

[17] L. N. Trefethen and D. Bau. *Numerical Linear Algebra.* SLAM, Philadelphia, 1997.

[18] J. M. Wang, C. C. Chu, Q. Yu, and E. S. Kuh. On projection-based algorithms for model-order reduction of interconnects. *IEEE Trans. Circuits Syst. I,* 49:1563-1585, 2002.

What is claimed is:

1. A computer implemented method for making a simplified circuit model comprising:
    using said computer to perform the steps of;
    (A) inputting a mesh circuit and values of parameters of the mesh circuit;
    (B) establishing a state matrix of an original circuit mode;
    (C) inputting an order of a simplified circuit and acquiring a corresponding orthonormal matrix by an adaptive-order multipoint rational Arnoldi algorithm, wherein the adaptive-order multipoint rational Arnoldi algorithm consists of:
        (a) Approximation model using moment matching method;
        (b) Arnoldi algorithm that features Krylov subspace iteration;
        (c) An approximation model that contains several expansion frequencies; and
        (d) An expansion frequency selection methods;
    (D) orthogonally projecting the state matrix of the original circuit mode into the corresponding orthonormal matrix of the simplified circuit;
    (E) outputting the simplified circuit model from the orthogonally projection; and
    (F) storing the simplified circuit model in the computer memory.

2. The method for making the simplified circuit model as defined in claim 1, wherein the Arnoldi algorithm that features Krylov subspace iteration successively establishes approximate simplified circuits by iteration, wherein as the order of the simplified circuit increases by one order, a newly formed simplified circuit requires only one additional iteration.

3. The method for making the simplified circuit model as defined in claim 1, wherein the approximation model that contains several expansion frequencies makes the simplified circuit meet a designing regulation of frequency responding values of a range, and offsets reducing the range to one expansion frequency.

4. The method for making the simplified circuit model as defined in claim 1, wherein the expansion frequency selection method in accordance with the original circuit mode selects an expansion frequency that makes an approximation of the simplified circuit in each iteration of the adaptive-order rational multipoint Arnoldi algorithm.

5. A computer implemented method for making a simplified circuit model comprising:
    using said computer to perform the steps of;
    (A) inputting a mesh circuit and values of parameters of the mesh circuit;
    (B) establishing a state matrix of an original circuit mode;
    (C) inputting an order of a simplified circuit and acquiring a corresponding orthonormal matrix by an adaptive-order multipoint rational Arnoldi algorithm, wherein the adaptive-order multipoint rational Arnoldi algorithm follows the following:
        (a) inputting the state matrix of the original circuit mode, pre-set expansion frequencies and data about a maximum iteration times of the algorithm;
        (b) vectoring a first Krylov series corresponding with an initial setting frequency point;
        (c) determining an expansion frequency in each iteration;
        (d) carrying out operation of the multipoint rational Arnoldi algorithm in each iteration; and
        (e) outputting the orthonormal matrix that matches the maximum iteration times of the multipoint rational Arnoldi algorithm;
    (D) orthogonally projecting the state matrix of the original circuit mode into the corresponding orthonormal matrix of the simplified circuit;
    (E) outputting the simplified circuit model from the orthogonally projection; and (F) storing the simplified circuit model in the computer memory.

6. The method for making the simplified circuit model as defined in claim 5, wherein determining the expansion frequency in j times iteration comprises making the maximum advancing moment between the simplified circuits of j order and (j−1) order; comparing the difference between the moment value of the original circuit at different expansion frequencies and the next unmatched moment value of simplified circuit of (j−1) order; and using the expansion frequency with the maximum difference in moment matching method.

7. The method for making the simplified circuit model as defined in claim 6, wherein comparing the difference between the moment value uses:

$$\max_{s_i \in s} |Y^{(j+1)}(s_i) - \hat{Y}^{(j+1)}(s_i)| = \max_{s_i \in s} |h_\pi(s_i) c^T r^{(j-1)}(s_i)|$$

where,

- $s_i$: in each given group of frequency points for the transfer function of expansion original circuit system $\{s_1, s_2, \ldots, s_{imax}\}$, $s_i$ is the number i;
- q: after the adaptive-order multipoint rational Arnoldi method has undergone q times iterations, the approximate simplified circuit can match the moment of q order original circuit;
- $X(j)(s_i)$: the moment of j order original circuit expanded at frequency point $s_i$, $j <= q$;
- $\hat{X}^{(j)}(s_i)$: The j order moment of approximate simplified circuit that has matched j order original circuit moment and expanded at frequency point $s_i$;
- $r(j−1)(s_i)$: The complement vector produced by substituting the vector of Krylov series of adaptive-order multipoint rational Arnoldi method at (j−1) times iterations that corresponding expansion frequency $s_i$ into modificatory Gram-Schmidt perpendicularity; and
- $h\pi(s_i)$: $h\pi(s_i) = \Pi j \|r(j−1)(s_i)\|$, means that frequency point $s_i$ is selected as the optimal expansion frequency only when the adaptive-order multipoint rational Arnoldi method iterates for j times, and is regarded as the product of the length of complement vector generated from previous iteration, otherwise, the value remains unchanged.

8. The method for making the simplified circuit model as defined in claim 5, wherein the multipoint rational Arnoldi algorithm includes:

(a) carrying out the orthogonally projection between the vector of Krylov series corresponding with the expansion frequency of the iteration and the orthogonal matrix generated by the previous iteration to produce a new orthogonal vector and fulfill the moment matching method; and (b) carrying out the orthogonally projection between the vector of next unmatched Krylov series corresponding with each expansion frequency of the iteration and the orthogonal matrix generated by the previous iteration and used to calculate the optimal expansion frequency of the next iteration.

\* \* \* \* \*